(12) United States Patent
Nadaud et al.

(10) Patent No.: US 6,875,319 B2
(45) Date of Patent: Apr. 5, 2005

(54) SUBSTRATE WITH PHOTOCATALYTIC COATING

(75) Inventors: Nicolas Nadaud, Gentilly (FR); Xavier Talpaert, Paris (FR); Veronique Rondeau, Drancy (FR)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 10/380,170

(22) PCT Filed: Sep. 19, 2001

(86) PCT No.: PCT/FR01/02906

§ 371 (c)(1),
(2), (4) Date: Sep. 4, 2003

(87) PCT Pub. No.: WO02/24971

PCT Pub. Date: Mar. 28, 2002

(65) Prior Publication Data

US 2004/0043260 A1 Mar. 4, 2004

(30) Foreign Application Priority Data

Sep. 20, 2000 (FR) ............................................. 00 11959

(51) Int. Cl.⁷ .............................................. C23C 14/34
(52) U.S. Cl. .............................. 204/192.1; 204/298.12; 204/298.13
(58) Field of Search .................................. 428/426, 428, 428/432, 433, 434, 220, 336; 204/192.1, 298.12, 298.13

(56) References Cited

U.S. PATENT DOCUMENTS 5,332,618 A 7/1994 Austin
5,854,708 A * 12/1998 Komatsu et al. ............ 359/512
6,037,289 A * 3/2000 Chopin et al. ................. 502/2

FOREIGN PATENT DOCUMENTS

EP 0 901 991 3/1999
EP 850203 B1 * 1/2001 ............ B01J/23/10
JP 10 196229 7/1998
JP 11 092176 4/1999
WO 97 10186 3/1997
WO 98 41480 9/1998
WO 00 27771 5/2000

OTHER PUBLICATIONS

G.J. Exarhos et al.: "Raman characterization of all–dielectric multilayer sIO/sub 2/TiO/sub 2/ optical coatings" Applied Optics, vol. 23, No. 12, pp. 1986–1988 Jun. 15, 1984.

Wang Huiyao et al: "Effects of substrate temperature on the microstructure and photocatalytic reactivity of TiO/sub 2/films" Journal of Materials Science: Materials in Electronics, vol. 9, no. 5, pp. 327–330 10/98.

Tianmin Wang et al.: "The effect of properties of semiconductor oxide thin films on photocatalytic decompositio of dyeing waste water" Symposium Q on Thin Films, IUMR–S–ICA–97, vol. 334, no. 1–2, pp. 103–108 Sep. 16, 1997–Sep. 18, 1997.

Meng Li–Jian et al.: "The Effect of substrate temperature on the properties of D.C. reactive magnetron sputtered titianium oxide films" Thin Solid Films, vol. 223, no. 2, pp. 242–247, Feb. 15, 1993.

I. Petrov et al.: "Ion–assisted growth of Ti1–xAIxN/Ti1–ybyN multilayers by combined cathodic–arc/magnetron–sputter deposition" Thin Solid Films, vol. 302, no. 1–2, pp. 179–192, Jun. 20, 1997.

* cited by examiner

*Primary Examiner*—Stephen Stein
(74) *Attorney, Agent, or Firm*—Oblon, Spivak, McClelland, Maier & Neustadt, P.C.

(57) ABSTRACT

The invention concerns a method from cathode spray deposition of a coating with photocatalytic properties comprising titanium oxide at least partly crystallised in anastatic form on a transparent or semi-transparent support substrate, such as glass, vitroceramic, plastic. The substrate is sprayed under a pressure of at least 2 Pa. The invention also concerns the resulting coated substrate, wherein said substrate constitutes the top layer of a series of thin antiglare layers.

11 Claims, No Drawings

SUBSTRATE WITH PHOTOCATALYTIC COATING

The invention relates to generally transparent or semi-transparent substrates, especially made of glass, plastic or glass-ceramic, and provided with a coating having photocatalytic properties in order to endow them with an antistaining function or, more exactly, a self-cleaning function.

An important application of these substrates relates to glazing, which may be in very varied applications, such as utilitarian glazing, glazing used in domestic electrical appliances, windows for vehicles, and windows for buildings.

It also applies to reflective glazing of the mirror type (mirrors for dwellings or rear-view mirrors for vehicles) and to opacified glazing of the apron wall or curtain walling type.

The invention also applies, similarly, to nontransparent substrates, such as ceramic substrates or any other substrate able in particular to be used as an architectural material (metal, tiling, etc.). It preferably applies, whatever the nature of the substrate, to substantially plane or slightly curved substrates.

Photocatalytic coatings have already been studied, especially those based on titanium oxide crystallized in the anatase form. Their ability to degrade stains of organic origin or microorganisms under the action of UV radiation is greatly beneficial. They also often have a hydrophilic nature, which allows the removal of inorganic stains by the spraying of water or, in the case of exterior windows, by rain.

This type of coating with antistaining, bactericidal and algicidal properties has already been described, especially in patent WO 97/10186, which describes several methods of obtaining them.

The aim of the invention is therefore to improve the techniques for depositing this type of coating, especially for the purpose of simplifying them. In parallel, the aim of the invention is also to improve the appearance of the coating, more particularly to improve the optical properties of the substrate which is provided therewith.

The subject of the invention is firstly a process for depositing a coating having photocatalytic properties by sputtering, said coating comprising titanium oxide at least partly crystallized in the anatase form on a transparent or semitransparent carrier substrate. The feature of the invention consists in carrying out the sputtering on the substrate at a deposition pressure of at least 2 pascals. It is preferably at most 6.67 Pa and especially at least 2.67 Pa (that is to say at least 15 millitorr, especially between 20 and 50 millitorr).

In point of fact, as is known from the aforementioned patent WO 97/10186, this type of coating can be deposited by sputtering. This is a vacuum technique which in particular allows the thicknesses and the stoichiometry of the deposited layers to be very finely adjusted. It is generally enhanced by a magnetic field for greater efficiency. It may be reactive: in this case, an essentially metallic target is used, here a target based on titanium (possibly alloyed with another metal or with silicon), and the sputtering is carried out in an oxidizing atmosphere, generally an $Ar/O_2$ mixture. It may also be nonreactive: in this case a target called a ceramic target is used, which is already in the oxidized form of titanium (possibly alloyed).

However, the layers obtained by this type of technique are generally amorphous, whereas the functionality of the coating according to the invention is directly tied to the fact that it must be significantly crystalline. This is the reason why, as is recommended in the aforementioned patent, it is necessary to crystallize (or increase the degree of crystallization) of the coating by making it undergo a heat treatment, for example from about 30 minutes to several hours at at least 400° C.

According to the invention, it has been shown that a pressure as high as this favors particular crystallization of the layer and a density/roughness level which have a significant impact on the level of photocatalytic properties of the coating. In some cases, the annealing may become optional. To be specific, the deposition pressures generally used for metal oxides are usually within the 2 to 8 millitorr (i.e. 0.27 to 1.07 Pa) range: the invention therefore uses deposition pressures which are very unusual in this field.

It has also been shown within the context of the present invention that the post-deposition treatment step could possibly be eliminated, or at the very least made optional (and/or limited in terms of time or temperature), by sputtering the layer, not at ambient temperature, but on a hot substrate, especially heating to at least 100° C. This heating during deposition is alternative or cumulative with the abovementioned use of high pressures.

This heating has at least five advantages:

- a power saving during manufacture;
- the possibility of using substrates which would be unable to withstand heat treatments at temperatures of 400 or 500° C., at least without degradation;
- if the annealing requires the interposition between substrate and photocatalytic coating of a barrier layer preventing the diffusion of elements from the substrate (of the alkali metal type when it is made of glass), the possibility of using a thinner barrier layer, or even of completely dispensing with the barrier layer, since the heat treatment according to the invention is much less aggressive than an annealing operation;
- a much shorter manufacturing cycle (since the heat treatment of the substrate is substantially shortened and carried out at a substantially lower temperature);
- the need to store "semifinished" products to be annealed is eliminated.

However, levels of photocatalytic activity in the coatings very similar to those of coatings which are deposited and then annealed are obtained.

However, this was not a foregone conclusion, insofar as one might have expected that a prolonged annealing operation would be indispensable for making the crystalline seeds grow within the amorphous oxide matrix. This has not been the case: hot deposition favors direct deposition of an at least partly crystallized layer.

Nor was it obvious that the coating thus deposited "hot" would preferentially crystallize in the anatase form rather than in the rutile form (the anatase form is much more photocatalytic than the rutile or broockite form of titanium oxide).

There are various alternative ways of implementing the invention, especially depending on the type of sputtering apparatus available. Thus, it is possible to heat the substrate prior to the actual deposition, outside the vacuum chamber. It is also possible to heat the substrate during deposition, when the deposition chamber is fitted with ad hoc heating means. The substrate may therefore be heated before the coating is sputtered and/or while it is being sputtered. The heating may also be gradual during deposition, or may affect only part of the thickness of the deposited layer (for example the upper part).

Advantageously, while the layer is being sputtered, the substrate is at a temperature between 150 and 350° C., preferably at least 200° C. and especially between 210 and 280° C. Surprisingly, it has therefore been possible to obtain sufficiently crystallized layers without having to heat the substrate up to the temperatures generally used to carry out annealing operations, namely at least 400° C. to 500° C.

In general, when the coating is essentially based on titanium oxide ($TiO_2$), and when it is deposited by sputtering ("hot" or at ambient temperature), it has quite a high refractive index—greater than 2 or than 2.1 or than 2.15 or 2.2. It is generally between 2.15 and 2.35 or between 2.35 and 2.50 (it may be slightly substoichiometric), especially between 2.40 and 2.45. This is a feature quite specific to this type of deposition, since coatings of the same type deposited by other techniques, for example by the sol-gel technique, tend to be much more porous and have significantly lower refractive indices (below 2 and even below 1.8 or 1.7). The invention makes it possible to obtain layers by sputtering which have a porosity and/or a roughness (especially an RMS roughness), of between 2.5 and 10 nm, enhancing its photocatalytic properties. Consequently, they may have refractive indices of about 2.15 or 2.35, less than those usually obtained by sputtering—indirect proof of their porosity. This is an asset from the optical standpoint, since layers with a lower refractive index have a less reflective appearance for a given thickness.

It has been observed that the crystallographic structure of the coatings is influenced by the fact that they are deposited cold and then annealed, or deposited hot. Thus, quite unexpectedly, the coatings deposited "hot" and/or at high pressure, in accordance with the invention, generally have a $TiO_2$ mean crystallite size generally less than or equal to 50 or 40 or 30 nm, especially between 15 and 30 nm or between 20 and 40 nm. Coatings deposited in a standard manner, especially "cold" and then annealed, tend to comprise crystallites of larger size, namely at least 30 or 40 nm and generally between 40 and 50 nm, when standard deposition pressures are used.

On the other hand, if, according to one variant of the invention, the coating is deposited at ambient temperature but at high pressure, and then an annealing operation is carried out, the size of the crystallites is of smaller size (20–40 nm), comparable to that of the crystallites of coatings deposited hot, whether at high pressure or low pressure.

The photocatalytic activity of coatings deposited at ambient temperature and at high pressure, and then annealed, is much better than that of coatings deposited at ambient temperature and at low pressure, and then annealed: all other things being equal, it is clear that the deposition pressure has a pronounced influence on the performance of the coating, most particularly in the case of "cold" deposition.

Heating simultaneously with the growth of the layer results in the formation of a microstructure conducive to a roughness and/or porosity favorable to the photocatalytic property. This is somewhat the same as when a high deposition pressure is used (with "cold" deposition followed by an annealing operation, for example).

Thanks to the process according to the invention (by hot and/or high-pressure deposition), it is possible to obtain coatings having an PMS (root mean square) roughness measured by atomic force microscopy, taking measurements over the same surface with a pitch of 2 micrometers:

- of at least 2 nm, especially at least 2.5 nm and preferably between 2.8 nm and 4.6 nm in the case of deposition at ambient temperature and at high pressure within the meaning of the invention (2 to 5 Pa), followed by annealing operations;
- of at least 4 nm, especially at least 5 nm and preferably between 5.5 and 6.0 nm in the case of hot deposition (at about 250° C.) without annealing, whether at high pressure or low pressure.

By way of comparison, the roughness of the coatings deposited at ambient temperature and at standard pressure (especially $2 \times 10^{-3}$ millibars, i.e. 0.2 Pa) and then annealed is only 2 nm at best: this proves that the use of high pressures makes it possible to achieve surprisingly high roughnesses for layers deposited by sputtering, this consequently improving the photocatalytic properties of the coating.

Advantageously, the coating has a geometrical thickness of less than 150 nm, especially between 80 and 120 nm or between 10 and 25 nm. It turns out that the coating, even when very thin, can have sufficiently photocatalytic properties (at least for some applications) with, in addition, the optical advantage of being hardly reflective.

As will have been seen above, the sputtering of the coating may be reactive or nonreactive. In either case, the target to be sputtered may be doped, especially with at least one metal. This may be one or more metals chosen from the following list: Nb, Ta, Fe, Bi, Co, Ni, Cu, Ru, Ce, Mo, Al.

The deposition process according to the invention may be preceded and/or followed by one or more steps of depositing one or more other thin layers, especially with an optical, antistatic, anticolor, antireflective, hydrophilic or protective function, or to increase the roughness of the coating having photocatalytic properties. Thus, it has been observed that there may be advantage in depositing one layer (at least) so that it is particularly rough, for example by pyrolysis or by sol-gel, and then the photocatalytic coating; the coating then tends to "follow" the roughness of the underlayer and in fact to have, it too, a significant roughness, whereas layers deposited by sputtering have instead a tendency to be not very rough. Thus, it is possible to form multilayers with a sublayer (having an RMS roughness of, for example, at least 5 or 10 nm) of the $SiO_2$, SiOC or SiON type, deposited by chemical vapor deposition (CVD), and then the photocatalytic layer by sputtering.

The invention therefore comprises any combination of deposition of one or more layers by sputtering (including at least the photocatalytic coating) and deposition of the other layer(s) of the multilayer by a technique involving thermal decomposition, especially pyrolysis (in liquid, vapor or pulverulant phase), or a sol-gel technique.

As was seen above, photocatalytic $TiO_2$-based coatings have a high refractive index. This means that they are reflective and endow their carrier substrate with a reflective appearance often regarded as not being very esthetically attractive. Apart from this shiny character, the color in reflection may also be undesirable. It is not simple to improve this appearance in reflection, since the photocatalytic functionality imposes constraints—the coating must in general be in contact with the external atmosphere in order to receive UV radiation and degrade the external stains. It therefore cannot be covered with a low-index layer (unless this is very thin and/or porous). It must also have a specific minimum thickness in order to be sufficiently effective.

Another part of the present invention has therefore consisted in improving the appearance of the substrate in reflection, without disturbing the photocatalytic activity of the coating, especially by lowering its light reflection as much as possible and/or by giving it a color in reflection which is as neutral as possible.

The subject of the invention is therefore also the transparent or semitransparent substrate defined above, provided over at least part of at least one of its faces with a photocatalytic coating comprising titanium oxide at least partly crystallized as anatase, this coating having a high refractive index, of at least 2 or 2.1 or 2.2. According to the invention, this coating is regarded as forming part of a multilayer consisting of thin antireflection layers, the coating being the final layer (that is to say the layer furthest from the carrier substrate). The antireflection multilayer is composed of an alternation of high-index and low-index layers and is therefore completed in the present case with the layer having a high photocatalytic index. This term "antireflection" is used for convenience: in general, it is employed when it is desired to obtain a light reflection less than that which the substrate alone would have. Within the context of the invention, it is more a question of limiting the increase in light reflection (and/or modifying or attenuating its color in reflection) caused by the use of a coating containing titanium oxide.

Within the context of the invention, the term "layer" is understood to mean a single layer or a superposition of layers. If it is a superposition of layers, its overall thickness is regarded as the sum of the thicknesses of each of the layers and its overall index is regarded as the average of all of the refractive indices of said layers. This also applies to the photocatalytic coating. It may also be associated with another high-index layer.

Within the context of the invention and as recalled above, the term "antireflection" is understood to mean the function which makes it possible to lower the light reflection value of the coated substrate and/or to attenuate its color in reflection, especially so as to make it as pale and as neutral as possible, i.e. as esthetically attractive as possible (in this case one also speaks of an "anticolor" effect).

This is a quite free and unexpected adaptation of conventional antireflection multilayers. This is because, in a known manner, these multilayers alternate high-index and low-index layers and are completed with low-index layers (the index being as close as possible to the refractive index of air, equal to 1) and are generally layers based on $SiO_2$, $MgF_2$, etc. However, in the present case, the multilayer is completed with a high-index layer, something which is quite paradoxical. Nevertheless, by appropriately selecting the characteristics of the various layers, this particular antireflection multilayer is able to significantly attenuate the reflective nature intrinsic to high-index $TiO_2$ and to give the substrate an acceptable color in reflection (neutral, in pale tints avoiding reds and other hot colors, deemed not very esthetically attractive, in favor of gray, blue or especially green).

Advantageously, the photocatalytic coating has a refractive index greater than or equal to 2.30, especially between 2.35 and 2.50, or between 2.40 and 2.45 (as seen above, it is also possible to deposit it so that it has an index of only 2.10 to 2.30). It is preferably deposited by sputtering. Its optical thickness, in conjunction with the thicknesses of the other layers of the multilayer, is advantageously selected so as to reduce the light reflection of the substrate. It has been shown that the optimum optical thickness is preferably in the region of $\lambda/2$, where $\lambda$ is about 580 nm. This corresponds to an optical thickness of between 250 and 350 nm, especially between 270 and 310 nm, and to a geometrical thickness of between 80 and 120 nm, especially between 90 and 110 nm. This geometrical thickness range has proved sufficient to obtain, in parallel, a photocatalytic activity regarded as sufficient (the photocatalytic activity depends in fact on numerous parameters, including the thickness but also the surface roughness, the crystalline morphology of the layer, its porosity, etc.). It is also possible to use substantially thinner layers, having in particular a geometrical thickness between 10 and 25 nm.

Depending on whether the coating is deposited by "hot" sputtering or sputtering at cold ambient temperature and annealing, it contains crystallites varying in size as was seen above (generally less than 30 nm when sputtered "hot" and about 30 to 50 nm or more when sputtered at ambient temperature and at standard pressure, as seen above).

The antireflection multilayer of the invention, in its simplest embodiment, comprises three layers, these being, in succession, a high-index layer, a low-index layer and then the high-index photocatalytic coating.

The high-index layer(s) of the multilayer, apart from the photocatalytic coating, has (have) in general an index of at least 1.9, especially between 1.9 and 2.3 or between 1.9 and 2.2. Said layer(s) may be made of zinc oxide, tin oxide, zirconium oxide, aluminum nitride or silicon nitride. It (they) may also be made of a mixture of at least two of these compounds.

The optical thickness of these high-index layers is selected. Their optimum optical thickness is preferably in the region of $\lambda/10$, where $\lambda$ is about 580 nm. This corresponds to an optical thickness of between 48 and 68 nm, especially between 53 and 63 nm, and to a geometrical thickness of between 20 and 40 nm, especially between 25 and 35 nm. It is also possible to choose a smaller thickness, especially between 20 and 48 nm.

The low-index layer(s) has (have) in general an index of between 1.4 and 1.75, especially between 1.45 and 1.65. They may, for example, be based on silicon oxide, aluminum oxide or a mixture of the two. The optical thickness of these low-index layers is selected: their optimum optical thickness is preferably in the region of $\lambda/20$, where $\lambda$ is about 580 nm. This corresponds to an optical thickness of between 20 and 79 nm, especially between 19 and 39 nm, especially between 25 and 35 nm, and to a geometrical thickness of between 12 and 50 nm, especially between 15 and 30 nm, for example between 20 and 28 nm.

According to another variant, in the abovementioned three-layer multilayer, it is possible to replace the high-index layer/low-index layer sequence with a layer having an "intermediate" refractive index, that is to say one preferably greater than 1.65 and less than 1.9. The preferred range of indices is between 1.75 and 1.85. It may be based on silicon oxynitride and/or aluminum oxynitride. It may also be based on a mixture of a low-index oxide such as $SiO_2$ and at least one oxide of higher index, such as $SnO_2$, $ZnO$, $ZrO_2$, $TiO_2$ (the relative proportion between the oxides allows the index to be adjusted).

It is also possible to use this intermediate layer to replace the first sequence—high-index layer/low-index layer—with a multilayer containing not three but five or seven layers for example.

The optical thickness of this intermediate-index layer is selected. The optimum optical thickness is in the region of $\lambda/4$, where $\lambda$ is about 580 nm. This corresponds to an optical thickness of between 120 and 150 nm, especially between 125 and 135 nm, and to a geometrical thickness of between 65 and 80 nm, especially between 68 and 76 nm.

As mentioned above, these various optical thickness selections take into account the overall appearance of the substrate in reflection: endeavors are made not only to lower the light reflection value RL but also to give it a tint which today is deemed to be esthetically attractive (that is to say rather in cold colors than toward yellow or red) and has the lowest possible intensity. It is therefore necessary to find the best compromise so that, overall, the appearance of the substrate in reflection is better. Depending on the applications, preference may be given more to lowering the value of Rl [sic] or more to selecting a particular calorimetric response in reflection (for example quantified by the a* and b* values of the L,a*,b* colorimetry system or by the value of the dominant wavelength associated with the color purity).

Advantageously, all of the layers of the antireflection multilayer may be deposited by sputtering, one after the other, on the same production line.

According to an optional variant of the invention, it is possible to insert, between the substrate and the antireflection multilayer, a barrier layer blocking the species liable to diffuse out of the substrate. These are, in particular, alkali metals when the substrate is made of glass. For example, the barrier layer is based on silicon oxide (or oxycarbide): $SiO_2$ may be deposited by sputtering and SiOC, in a known manner, by chemical vapor deposition (CVD). It preferably has a thickness of at least 50 nm, for example between 80 and 200 nm. When chosen in this type of material, having a relatively low index (around 1.45 to 1.55), it is in fact, generally, pretty much "neutral" from the optical standpoint. Silicon oxide may contain minority elements, especially chosen from Al, C, N.

The subject of the invention is also glazing, especially single-glazing (a rigid substrate), laminated glazing and multiple glazing of the double-glazing type, which comprises at least one substrate coated in the manner described above.

Said glazing preferably has, thanks to the antireflection effect of the invention, a light reflection $R_L$ (on the multilayer side) which remains at most 20%, especially at most 18%. Preferably, this light reflection has a pleasant tint in the blues or greens, with negative a* and b* values in the (L,a*,b*) colorimetry system and especially less than 3 or 2.5 in absolute values. The tint is thus a color both pleasing to the eye and pale, of low intensity.

The glazing may also include one or more other functional coatings (deposited by sputtering or pyrolysis or sol-gel), either on the same face of the substrate provided with the photocatalytic coating, or on the opposite face of this substrate, or on a face of another substrate associated with the first in a glazing unit (double glazing or laminated glazing). It is also possible to have a double-glazing unit of the glass/gas-filled cavity/glass type with, on the exterior face(s) of the glass pane(s), the photocatalytic coating and, on the internal faces (turned toward the gas-filled cavity), a multilayer containing one or two silver layers. The same type of configuration applies to laminated glazing.

The other functional coating(s) may in particular be an antistaining, solar-protection, low-emissivity, heating, hydrophobic, hydrophilic, antireflection or antistatic coating or another photocatalytic coating, etc. Mention may especially be made of solar-protection or low-emissivity multilayers consisting of one or more layers of silver, or nickel-chromium, or titanium nitride or zirconium nitride. In the case of layers based on a metal nitride, it is possible to use a CVD technique.

The invention will now be described in greater detail, with nonlimiting illustrative examples.

Example 1 and Comparative Example 1 relate to the hot deposition of photocatalytic $TiO_2$ layers by sputtering.

EXAMPLE 1

The following were deposited on a clear silica-soda-lime glass 4 mm in thickness: an 80-nm SiOC first layer by CVD and then a 90-nm photocatalytic $TiO_2$ second layer (it is also possible to substitute the SiOC layer with an Al:$SiO_2$ layer obtained by reactive sputtering from an Al-doped Si target).

The $TiO_2$ layer was deposited by magnetic-field-enhanced sputtering. This is reactive sputtering, in the presence of oxygen, from a titanium target. The glass was preheated to a temperature of about 220° C. to 250° C. This temperature was kept constant to within 5° C. during sputtering of the layer, using a heater placed opposite the target.

The $TiO_2$ layer obtained had a refractive index of 2.44. It crystallized in the anatase form (it may also include amorphous regions), with an average crystallite size of less than 25 nm.

Its photocatalytic activity was quantified by means of a test using palmitic acid: this consists in depositing a given thickness of palmitic acid on a photocatalytic coating, in exposing the latter to UV radiation centered on 365 nm with a surface power density of about 50 W/m² throughout the entire duration of the test, and then in measuring the rate of disappearance of the palmitic acid according to the following equation:

$$V \text{ (nm/h)} = \frac{[\text{palmitic acid thickness (nm)}]}{[2t_{1/2 disappearance} \text{ (h)}]}$$

With the layer according to the invention, a photocatalytic activity of at least 10 nm/h, especially at least 20 nm/h, especially between 20 and 100 nm/h, depending on the choice of the deposition parameters of the pressure and temperature type, was obtained using this calculation.

The glass thus coated with the two layers had, under illuminant $D_{65}$, a light reflection $R_L$ of 23%, with a* and b* values in reflection in the (L,a*,b*) colorimetry system of about 17 and 28, respectively.

The photocatalytic activity of the layer is therefore useful, but its optical appearance is still clearly reflective, with too intense a color.

It should be noted that it is possible to increase the photocatalytic activity of the layer by subjecting it, after deposition, to a conventional annealing operation (for one or several hours at at least 400° C.).

COMPARATIVE EXAMPLE 1

Example 1 was repeated, but this time the $TiO_2$ layer was deposited on an unheated substrate and then treated for four hours at about 500 to 550° C. Furthermore, the $SiO_2$ sublayer was thickened to 100 nm. The morphology of the layer was a little different, having a mean crystallite size somewhat greater than 30 nm.

Its photocatalytic activity was similar to that of the unannealed layer of Example 1, but it was less than it if a smaller thickness of $SiO_2$ sublayer was chosen.

This therefore confirms that the "hot" deposition according to the invention, making it possible to "save" on an often lengthy annealing operation, is not obtained to the detriment of the performance of the layer. This also confirms a subsidiary advantage of the invention: by depositing hot and dispensing with an annealing operation, it is possible to use, for identical photocatalytic performance, a thinner barrier sublayer (hence, again, resulting in a reduced product manufacturing cost).

Example 2 and the following examples relate to the incorporation of a photocatalytic layer of high-index $TiO_2$, said layer being especially deposited by sputtering, into antireflection multilayers in order to improve the optical properties thereof.

EXAMPLE 2

Realized

The following multilayer stack was deposited on a silica-soda-lime float glass 4 mm in thickness:

| | |
|---|---|
| $R_L$ (under illuminant $D_{65}$) = | 17.3% |
| a* ($R_L$) = | −2 |
| b* ($R_L$) = | −2.8 |
| $\lambda_d$ (dominant wavelength of the light reflection) = | 494 nm |
| $\rho_e$ (purity of the color in reflection) = | 2.5%. |

The $Si_3N_4$ layer (1) was deposited by reactive sputtering in the presence of nitrogen from an Al-doped Si target.

The $SiO_2$ layer (2) was deposited by reactive sputtering in the presence of oxygen from an Al-doped Si target.

The photocatalytic $TiO_2$ layer (3) was deposited hot, as described in Example 1.

Optionally, it is possible to insert an additional layer, between the glass and the $Si_3N_4$ layer, [lacuna] a layer of $SiO_2$ of about 100 nm obtained, like the other $SiO_2$ layer (2) described above. It has virtually no influence on the optical properties of the substrate and may serve as an alkali-metal barrier layer to the glass. This is optional, all the more so since the layers of the antireflection coating beneath the photocatalytic layer, namely the layers (1) and (2), themselves constitute very satisfactory barrier layers, in addition to their optical properties: these two layers already form a 100-nm barrier to the species liable to diffuse out of the glass.

The photocatalytic activity of the layer 3 was 80 nm/h.

Alternatively, a $TiO_2$ layer deposited cold and then annealed, as described in Comparative Example 1, could have been used.

The results for such a multilayer, in reflection on the multilayer side, were the following:

glass/$Si_3N_4^{(1)}$/$SiO_2^{(2)}$/$TiO_2^{(3)}$
30 nm 22 nm 104 nm (geometrical thicknesses).

This shows, compared with Example 1, a significant reduction in the value of $R_L$ and in this case a paler color in the blue-greens is obtained. Overall, the appearance in reflection is therefore esthetically and substantially improved.

EXAMPLE 3

This is very similar to Example 2, the only change being a slight reduction in the thickness of the $TiO_2$ layer.

Here, the following were deposited:

glass/$Si_3N_4^{(1)}$/$SiO_2^{(2)}$/$TiO_2^{(3)}$
30 nm 22 nm 99 nm (geometrical thicknesses).

The results in light reflection were the following (with the same conventions as for Example 2):

$R_L$ = 17.9%
$a^*$ = −0.8
$b^*$ = −0.7
$\lambda_d$ = 494 nm
$\rho e$ = 0.8%.

In this case, therefore, there is a slightly different compromise, with a slightly greater $R_L$ value but $a^*$ and $b^*$ values lower in terms of absolute values.

EXAMPLE 4

Modeling

This is very similar to Example 2, the only change being the thickness of the $Si_3N_4$ first layer:

glass/$Si_3N_4^{(1)}$/$SiO_2^{(2)}$/$TiO_2^{(3)}$
25 nm 22 nm 104 nm (geometrical thicknesses).

The results in light reflection is the following (again with the same conventions):

$R_L$ = 15.8%
$a^*$ = 0
$b^*$ = −9
$\lambda_d$ = 475 nm
$\rho e$ = 4.9%.

In this case, the value of $R_L$ is greatly lowered, but the color in reflection changes tint.

EXAMPLE 5

Modeling/Comparative

Here, compared with Example 2, all the thicknesses are changed.

We have:

glass/$Si_3N_4^{(1)}$/$SiO_2^{(2)}$/$TiO_2^{(3)}$
28 nm 30 nm 75 nm (geometrical thicknesses).

The results in light reflection are the following $R_L$ = 25.8%
$a^*$ = −0.3
$b^*$ = −0.7
$\lambda_d$ = 492 nm
$\rho e$ = 0.5%.

Although the substrate has a satisfactory color in reflection, it does have, however, an $R_L$ value well above 20%, which is too high: the chosen thicknesses are not optimal.

EXAMPLE 6

Modeling/Comparative

This example departs even further from the layer thicknesses recommended by the invention, with the following multilayer:

glass/$Si_3N_4^{(1)}$/$SiO_2^{(2)}$/$TiO_2^{(3)}$
20 nm 20 nm 60 nm (geometrical thicknesses).

The results in light reflection are the following:

$R_L$ = 30%
$a^*$ = 2.3
$b^*$ = 7.2
$\lambda_d$ = 587 nm
$\rho e$ = 14%.

The multilayer has both a very high $R_L$ value and a not very desirable and more intense color in reflection. Its appearance in reflection is therefore unsatisfactory.

EXAMPLE 7

Realized

The stack this time was as follows:

---
glass/SnO$_2$$^{(1)}$/SiO$_2$$^{(2)}$/TiO$_2$$^{(3)}$
30 nm 27 nm 105 nm (geometrical thicknesses).
---

Si$_3$N$_4$ has therefore been replaced with SnO$_2$, deposited by reactive sputtering in the presence of oxygen from a tin target.

The results in light reflection were the following:

---
$R_L$ = 17.4%
$a^*$ = −2.8
$b^*$ = −2.7
$\lambda_d$ = 496 nm
$\rho e$ = 2.8%.
---

The appearance in reflection is similar to that obtained in Example 2.

EXAMPLE 8

Modeled

Here, the first two layers are replaced with a single layer of silicog oxynitride SiON with an index of 1.84.

The multilayer is therefore the following:

---
glass/SiON/TiO$_2$
72 nm 101 nm (geometrical thicknesses).
---

The results in light reflection are the following:

---
$R_L$ = 17.4%
$a^*$ = 0
$b^*$ = −1.08
$\lambda_d$ = 480 nm
$\rho e$ = 1%.
---

The appearance in reflection is therefore satisfactory.

EXAMPLE 9

Modeled

This repeats Example 8, but with a 1.86 index for the SiON layer.

The appearance in reflection is slightly modified therefrom:

---
$R_L$ = 17.8%
$a^*$ = −1.1
$b^*$ = −1.5
$\lambda_d$ = 494 nm
$\rho e$ = 1.3%.
---

EXAMPLE 10

Realized

The multilayer was the following:

---
glass/Si$_3$N$_4$$^{(1)}$/SiO$_2$$^{(2)}$/TiO$_2$$^{(3)}$/TiO$_2$$^{(3)}$
24 nm 17.5 nm 24 nm 92.5 nm
---

The final high-index "layer" was therefore the superposition of an Si$_3$N$_4$ layer and a TiO$_2$ layer. The light reflection $R_L$ on the multilayer side was between 16.5 and 17.5%, and the photocatalytic activity was in the region of 80 nm/h.

EXAMPLE 11

Realized

The type of multilayer in Example 3 was repeated, but with different thicknesses. The multilayer was:

---
glass/Si$_3$N$_4$$^{(1)}$/SiO$_2$$^{(2)}$/TiO$_2$$^{(3)}$
14.5 nm 43 nm 14.5 nm
---

The light reflection on the multilayer side was between 13 and 16%. If each of the layers of the stack were varied by 3%, the optical variations in the substrate thus coated were the following:

---
$\Delta R_L$: 0.8%
$\Delta a^*$ ($R_L$): 0.3
$\Delta b^*$ ($R_L$): 1.3.
---

This example shows a photocatalytic activity of about 15 to 20 nm/h.

This example is useful on several counts: it is very insensitive to variations in thickness and will therefore be easy to produce on an industrial scale. It remains sufficiently photocatalytic, even though the titanium oxide layer is very thin. It is satisfactory from the calorimetric standpoint.

In conclusion, the invention has developed a novel way of vacuum-depositing layers containing photocatalytic TiO$_2$. It has also developed a novel type of antireflection/anticolor multilayer which is completed with a high-index layer, said multilayer being simple to produce on an industrial scale and significantly attenuating the reflective aspect of TiO$_2$ without degrading the photocatalytic properties thereof. It makes it possible to obtain glazing in the blues or in the pale greens in reflection, while maintaining consistent photocatalytic layer thicknesses of the order of one hundred nanometers. It is also possible to choose a substantially thinner, 12–30 nm, photocatalytic layer.

The invention in its two aspects (product and process) may apply in the same way to photocatalytic coatings which do not contain TiO$_2$.

The invention therefore proposes that these coatings be deposited "hot" and, alternatively, deposited at ambient temperature, followed by appropriate heat treatments, preferably with the deposition pressure being particularly controlled, in order to obtain vacuum-deposited layers having very unusual characteristics, resulting in remarkable antistaining properties.

What is claimed is:

1. A process for depositing a coating having photocatalytic properties by sputtering, said coating comprising titanium oxide at least partly crystallized in the anatase form on a transparent or semitransparent carrier substrate of glass, glass-ceramic or plastic, wherein the sputtering is carried out at a deposition pressure P of at least 2 Pa and at ambient temperature, the deposition of the coating being optionally followed by a heat treatment.

2. The process as claimed in claim 1, wherein the deposition pressure P is from 2.67 to 6.67 Pa.

3. The process as claimed in claim 1, wherein the process comprises said heat treatment, and wherein the heat treatment is carried out at a temperature of at least 400° C.

4. The process as claimed in claim 1, wherein the coating has a refractive index greater than 2.

5. The process as claimed in claim 1, wherein the coating comprises titanium oxide crystallites having a size of less than or equal to 50 nm.

6. The process as claimed in claim 1, wherein the coating has a RMS roughness of at least 2 nm.

7. The process as claimed in claim 1, wherein the coating has a geometrical thickness of less than 150 nm.

8. The process as claimed in claim 1, wherein the sputtering is carried out in a reactive manner from an essentially metallic target, or in a nonreactive manner from a ceramic target.

9. The process as claimed in claim 8, wherein the target to be sputtered is doped with a metal selected from the group consisting of Nb, Ta, Fe, Bi, Co, Ni, Cu, Ru, Ce, Mo, and Al.

10. The process as claimed in claim 1, wherein the process is preceded and/or followed by a step of depositing at least one layer by a sputtering technique or by a technique comprising thermal decomposition by pyrolysis or by sol-gel, to increase the roughness of the coating.

11. The process as claimed in claim 10, wherein the process is preceded by the deposition of at least one layer by pyrolysis or by chemical vapor deposition (CVD), said layer having a RMS roughness of at least 5 nm.

* * * * *